United States Patent
Guo et al.

(10) Patent No.: US 12,199,215 B2
(45) Date of Patent: Jan. 14, 2025

(54) LIGHT-EMITTING DEVICE AND DISPLAY APPARATUS

(71) Applicant: Industrial Technology Research Institute, Hsinchu (TW)

(72) Inventors: Yih-Der Guo, Hsinchu (TW); Ming-Hsien Wu, Tainan (TW); Yi-Chen Lin, Taipei (TW); Yao-Jun Tsai, Taoyuan (TW); Yen-Hsiang Fang, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 635 days.

(21) Appl. No.: 17/113,114

(22) Filed: Dec. 7, 2020

(65) Prior Publication Data

US 2021/0091265 A1 Mar. 25, 2021

Related U.S. Application Data

(63) Continuation-in-part of application No. 16/726,271, filed on Dec. 24, 2019, now abandoned.

(30) Foreign Application Priority Data

Aug. 21, 2019 (TW) ................. 108129900
Aug. 20, 2020 (TW) ................. 109128365

(51) Int. Cl.
*H01L 33/22* (2010.01)
*H01L 27/15* (2006.01)
(Continued)

(52) U.S. Cl.
CPC ............ *H01L 33/22* (2013.01); *H01L 27/156* (2013.01); *H01L 33/32* (2013.01); *H01L 33/38* (2013.01); *H01L 33/62* (2013.01)

(58) Field of Classification Search
CPC ....... H01L 33/22; H01L 27/156; H01L 33/32; H01L 33/38; H01L 33/62; H01L 25/0753; H01L 33/44; H01L 33/382
See application file for complete search history.

(56) References Cited

U.S. PATENT DOCUMENTS

| 2013/0119424 A1* | 5/2013 | Kang ...................... H01L 33/50 |
| | | 257/98 |
| 2013/0328097 A1* | 12/2013 | Nakada ................... H01L 33/38 |
| | | 257/99 |
| 2015/0155251 A1* | 6/2015 | Kawakita .............. H01L 33/647 |
| | | 257/773 |

(Continued)

FOREIGN PATENT DOCUMENTS

| CN | 106159073 | 11/2016 |
| CN | 106486569 | 3/2017 |

(Continued)

OTHER PUBLICATIONS https://scholarcommons.sc.edu/elct_facpub/106/Published in Applied Physics Letters, vol. 81, Issue 17, 2002, pp. 3194-3196 (Year: 2002).*

(Continued)

*Primary Examiner* — Su C Kim
(74) *Attorney, Agent, or Firm* — JCIPRNET

(57) ABSTRACT

A light-emitting device including an epitaxial layer, a support layer, an insulating layer, a first electrode pad, and a second electrode pad is provided. The epitaxial layer includes a first type doped semiconductor layer, a light-emitting layer and a second type doped semiconductor layer, wherein the light-emitting layer is disposed on a partial area of the first type doped semiconductor layer and is between the first type doped semiconductor layer and the second type doped semiconductor layer. The support layer covers the second type doped semiconductor layer while the insulating layer covers the epitaxial layer and the support layer. The first and the second electrode pads are disposed over the (Continued)

insulating layer and electrically connected to the first and the second type doped semiconductor layers, respectively. The support layer extends from a first position below the first electrode pad to a second position below the second electrode pad.

22 Claims, 13 Drawing Sheets

(51) Int. Cl.
    *H01L 33/32*     (2010.01)
    *H01L 33/38*     (2010.01)
    *H01L 33/62*     (2010.01)

(56) References Cited

U.S. PATENT DOCUMENTS

| | | | |
|---|---|---|---|
| 2017/0108173 A1* | 4/2017 | Kim | H01L 33/32 |
| 2017/0117259 A1* | 4/2017 | Xu | H01L 33/382 |
| 2019/0131281 A1 | 5/2019 | Liu et al. | |
| 2019/0172761 A1 | 6/2019 | Guo et al. | |

FOREIGN PATENT DOCUMENTS

| | | |
|---|---|---|
| CN | 107681034 | 2/2018 |
| CN | 108574032 | 9/2018 |
| CN | 109545937 | 3/2019 |
| CN | 109859647 | 6/2019 |
| CN | 109860364 | 6/2019 |
| CN | 109920899 | 6/2019 |
| CN | 110021686 | 7/2019 |
| CN | 110050512 | 7/2019 |
| KR | 1020120132211 | 12/2012 |
| TW | 201031033 | 8/2010 |
| TW | 201214806 | 4/2012 |
| TW | 201840021 | 11/2018 |

OTHER PUBLICATIONS

Office Action of Taiwan Counterpart Application, issued on Mar. 8, 2021, pp. 1-13.

"Office Action of China Counterpart Application", issued on Jul. 26, 2021, p. 1-p. 12.

* cited by examiner

LIGHT-EMITTING DEVICE AND DISPLAY APPARATUS

CROSS-REFERENCE TO RELATED APPLICATION

This application is a continuation-in-part application of and claims the priority benefit of U.S. application Ser. No. 16/726,271, filed on Dec. 24, 2019, now pending, which claims the priority benefit of Taiwan application serial no. 108129900, filed on Aug. 21, 2019. This application also claims the priority benefit of Taiwan application serial no. 109128365, filed on Aug. 20, 2020. The entirety of each of the above-mentioned patent applications is hereby incorporated by reference herein and made a part of this specification.

BACKGROUND

Technical Field

The present disclosure generally relates to a light-emitting device and a display apparatus.

Description of Related Art

With the advancement of fabrication process of light-emitting diode (LED) chips, LED display technology using LED chips as sub-pixels has been developed. In the process of preparing an LED display device, it is necessary to mount an LED chip array to a driving backplate. Currently, taking the micron-scale LED chips as display sub-pixels has gradually led to be the mainstream in the LED display apparatuses. Since the chip size and the thickness of a micron-scale LED chips are small, the micron-scale LED chip often faces problems of crack resulted from stress during a massive transfer of micron-scale LED chips to the driving backplate, thereby reducing the manufacturing yield of the LED display apparatuses.

According to the above, how to improve yield rate of the bonding between the micron-scale LED chips and the driving backplate is a problem that the research and development personnel need to overcome.

SUMMARY

The present disclosure provides a light-emitting device having better structural strength and a display apparatus having better structural strength.

According to an embodiment of the present disclosure, a light-emitting device is provided. The light-emitting device includes an epitaxial layer, a support layer, an insulating layer, a first electrode pad, and a second electrode pad. The epitaxial layer includes a first type doped semiconductor layer, a light-emitting layer and a second type doped semiconductor layer, wherein the light-emitting layer is disposed on a partial area of the first type doped semiconductor layer, and the light-emitting layer is located between the first type doped semiconductor layer and the second type doped semiconductor layer. The support layer covers the second type doped semiconductor layer and has a concave area recessed inward the epitaxial layer while the insulating layer covers the epitaxial layer and the support layer. The first electrode pad and the second electrode pad are disposed on the insulating layer, and the first electrode pad and the second electrode pad are electrically connected to the first type doped semiconductor layer and the second type doped semiconductor layer, respectively. The support layer extends from a first position below the first electrode pad to a second position below the second electrode pad. The first electrode pad and the second electrode pad cover an area outside the concave area.

According to an embodiment of the present disclosure, a light-emitting device is provided. The light-emitting device includes an epitaxial layer, an insulating layer, a first electrode pad, and a second electrode pad. The epitaxial layer includes a first type doped semiconductor layer, a light-emitting layer and a second type doped semiconductor layer, wherein the light-emitting layer is disposed on a partial area of a first surface of the first type doped semiconductor layer, and the light-emitting layer is located between the first type doped semiconductor layer and the second type doped semiconductor layer. The insulating layer covers the epitaxial layer. The first electrode pad and the second electrode pad are disposed on the insulating layer, and the first electrode pad and the second electrode pad are electrically connected to the first type doped semiconductor layer and the second type doped semiconductor layer, respectively. There is an included angle between a cleavage surface of the epitaxial layer and a sidewall of the first electrode pad or a sidewall of the second electrode pad.

According to an embodiment of the present disclosure, a display apparatus is provided. The display apparatus includes a driving backplate and a plurality of display pixels. The plurality of display pixels on the driving backplate is arranged in an array and electrically connected to the driving backplate, wherein each of the plurality of display pixels includes a plurality of sub-pixels respectively, and a part of the plurality of sub-pixels includes at least one of the aforementioned light-emitting device.

The foregoing will become better understood from a careful reading of a detailed description provided herein below with appropriate reference to the accompanying drawings.

DESCRIPTION OF THE EMBODIMENTS

Figure 1:
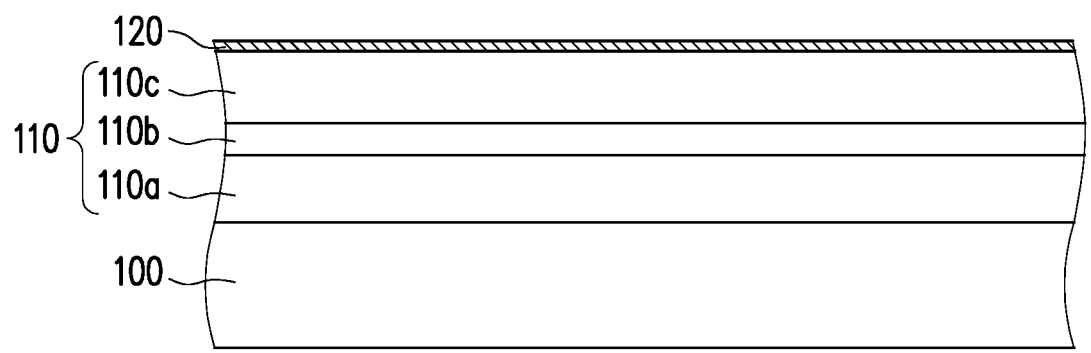
FIG. 1 to FIG. 8 are cross-sectional views illustrating the manufacturing process of a light-emitting device according to a first embodiment of this disclosure.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 to FIG. 8 are cross-sectional views illustrating the manufacturing process of a light-emitting device according to a first embodiment of this disclosure. FIG. 9 is a top view illustrating the light-emitting device of FIG. 8. Referring to FIG. 1, first, a substrate 100 is provided. Then, a first type doped semiconductor layer 110a, a light-emitting layer 110b, and a second type doped semiconductor layer 110c are sequentially formed on a surface of the substrate 100 by an epitaxial process, wherein the first type doped semiconductor layer 110a is disposed on the surface of the substrate 100, the light-emitting layer 110b is disposed on the first type doped semiconductor layer 110a, and the second type doped semiconductor layer 110c is disposed on the light-emitting layer 110b. The first type doped semiconductor layer 110a, the light-emitting layer 110b, and the second type doped semiconductor layer 110c are, for example, entirely deposited on the surface of the substrate 100 by the metal organic chemical vapor deposition (MOCVD). In one of exemplary embodiments of this disclosure, the substrate 100 is a sapphire substrate, a silicon carbide substrate, a silicon substrate, a GaAs substrate, a GaP substrate, a GaN substrate, an AlGaAs substrate or substrates made of other material. The substrate 100 may be a wafer form substrate. In one of exemplary embodiments of this disclosure, the first type doped semiconductor layer 110a includes an n-type doped semiconductor layer, the second type doped semiconductor layer 110c includes an p-type doped semiconductor layer, the light-emitting layer 110b between the first type doped semiconductor layer 110a and the second type doped semiconductor layer 110c includes a quantum well light-emitting layer. In other embodiments of this disclosure, the first type doped semiconductor layer 110a includes an p-type doped semiconductor layer, the second type doped semiconductor layer 110c includes an n-type doped semiconductor layer, the light-emitting layer 110b between the first type doped semiconductor layer 110a and the second type doped semiconductor layer 110c includes a quantum well light-emitting layer.

Taking a light-emitting diode chip capable of emitting blue or green light as an example, the substrate 100 includes a sapphire substrate, a silicon carbide substrate, a silicon substrate, etc., the first type doped semiconductor layer 110a includes an n-type doped GaN layer, the second type doped semiconductor layer 110c includes an p-type doped GaN layer, and the light-emitting layer 110b between the first type doped semiconductor layer 110a and the second type doped semiconductor layer 110c includes a multiple-quantum well (MQW) light-emitting layer, wherein the multiple-quantum well light-emitting layer is, for example, an InGaN/GaN stacked layer. However, the structure of the light-emitting layer 110b and the stacked number of the InGaN/GaN stacked layer in the multiple-quantum well light-emitting layer are not limited in the present disclosure. Taking a light-emitting diode chip capable of emitting red light as an example, the substrate 100 includes a GaAS substrate, a GaP substrate, a AlGaAs substrate or the like, the first type doped semiconductor layer 110a includes an n-type doped GaP layer, the second type doped semiconductor layer 110c includes an p-type doped GaP layer, and the light-emitting layer 110b between the first type doped semiconductor layer 110a and the second type doped semiconductor layer 110c includes the multiple-quantum well light-emitting layer, wherein the multiple-quantum well light-emitting layer is, for example, an AlGaInP/GaInP stacked layer. The first type doped semiconductor layer 110a, the light-emitting layer 110b, and the second type doped semiconductor layer 110c may be constituted the epitaxial layer 110. In one of exemplary embodiments of this disclosure, the epitaxial layer 110 may include a film layer having a corresponding crystal lattice, but the disclosure is not limited thereto.

After the first type doped semiconductor layer 110a, the light-emitting layer 110b, and the second type doped semiconductor layer 110c are formed, an electrode layer 120 is formed over the second type doped semiconductor layer 110c such that the electrode layer 120 entirely covers the upper surface of the second type doped semiconductor layer 110c. In one of exemplary embodiments of this disclosure, an excellent ohmic contact is formed between the electrode layer 120 and the second type doped semiconductor layer 110c, and the electrode layer 120 may be regarded as an ohmic contact layer. In one of exemplary embodiments of this disclosure, the electrode layer 120 is an optical reflective film, an optical transparent film or a transflective film having good ohmic contact with the second type doped semiconductor layer 110c. That is, the electrode layer 120 may be a reflective electrode layer, a transparent electrode layer or a transflective electrode layer. For example, the material of the electrode layer 120 includes aluminum (Al), silver (Ag), indium tin oxide (ITO), etc. The method of forming the electrode layer 120 may include chemical vapor deposition, physical vapor deposition, sputtering, electroless plating, chemical plating or the like.

Figure 2:
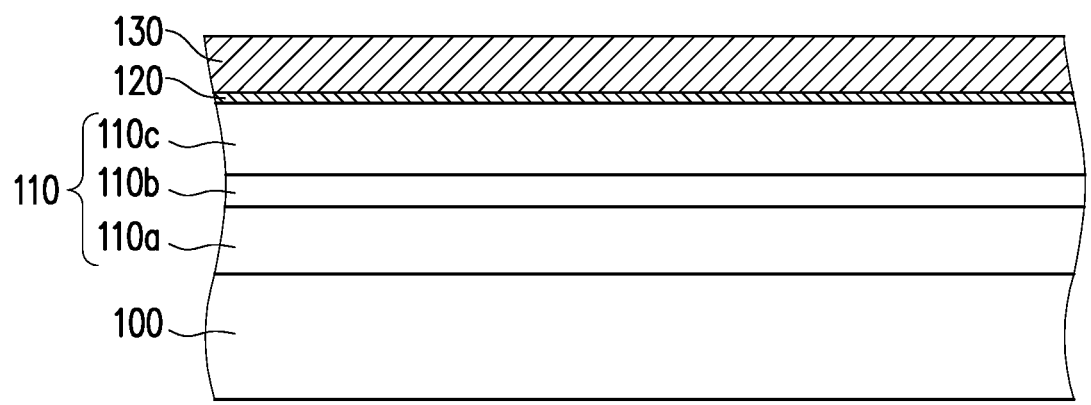

Referring to FIG. 2, a support layer 130 is formed on the electrode layer 120, wherein the support layer 130 entirely covers the upper surface of the electrode layer 120. In one of exemplary embodiments of this disclosure, the support layer 130 is a conductive layer (e.g., tungsten, titanium, nickel, gold or other conductive materials). Alternatively, the support layer 130 is a dielectric layer (e.g., aluminum oxide, silicon nitride, carbon dioxide, aluminum nitride or other dielectric materials). For example, the thickness of the support layer 130 ranges from 0.1 micrometer to 30 micrometers. The method of forming the support layer 130 may include chemical vapor deposition, physical vapor deposition, sputtering, electroless plating, chemical plating or the like. In one of exemplary embodiments of this disclosure, the electrode layer 120 is an optical reflective layer while the support layer 130 may have no optical reflection characteristics. In another one of exemplary embodiments of this disclosure, the support layer 130 is an optical reflective layer while the electrode layer 120 may have no optical reflection characteristics. In other embodiments of this disclosure, both of the electrode layer 120 and the support layer 130 may have optical reflection characteristics or may have no optical reflection characteristics.

Figure 3:
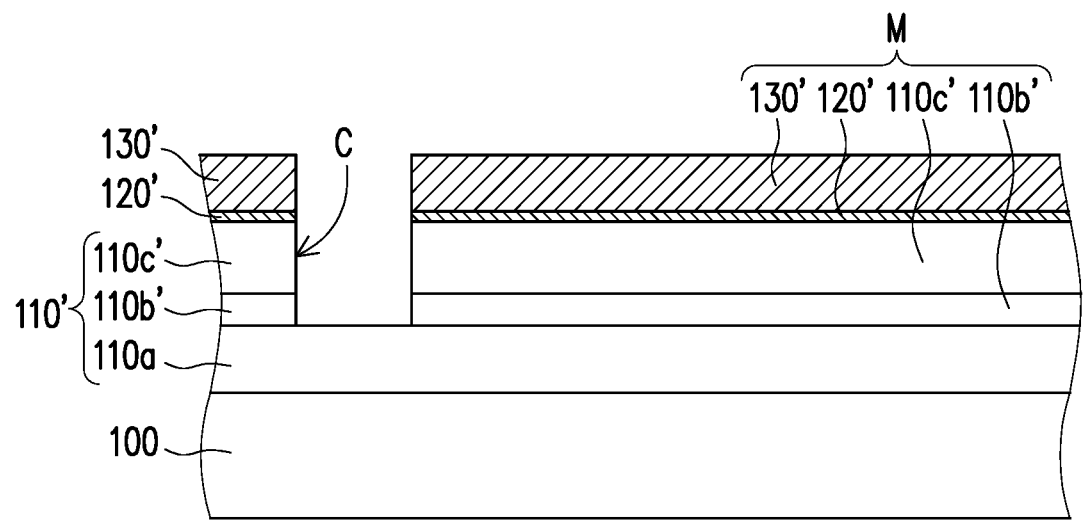

Referring to FIG. 2 and FIG. 3, after the support layer 130 is formed, the light-emitting layer 110b, the second type doped semiconductor layer 110c, the electrode layer 120 and the support layer 130 are patterned to form a plurality of semiconductor mesas M on the first type doped semiconductor layer 110a, wherein the semiconductor mesas M are spaced apart from each other and arranged in an array. Each of the plurality of semiconductor mesas M may include a light-emitting layer 110b' disposed on a partial area of the first type doped semiconductor layer 110a, a second type doped semiconductor layer 110c' disposed on the light-emitting layer 110b', an electrode layer 120' disposed on the second type doped semiconductor layer 110c', and a support layer 130' disposed on the electrode layer 120'. As shown in FIG. 3, the support layer 130' in accordance with the present embodiment has a fixed thickness and is distributed on a same level height so as to cover the upper surface of the epitaxial layer 110'. In other embodiments of this disclosure, the support layer 130' may cover only the upper surface of the epitaxial layer 110', but does not cover the side surface of the epitaxial layer 110'. Each of the plurality of semiconductor mesas M includes a contact through hole C, and a partial area of the first type doped semiconductor layer 110a may be exposed by the contact through hole C. In one of exemplary embodiments of this disclosure, the contact through hole C is distributed in the light-emitting layer 110b', the second type doped semiconductor layer 110c', the electrode layer 120', and the support layer 130'. And, the contact through hole C penetrates through the light-emitting layer 110b', the second type doped semiconductor layer 110c', the electrode layer 120', and the support layer 130' to expose a partial area of the first type doped semiconductor layer 110a. For example, the semiconductor mesa M having the contact through hole C therein may be formed by a photolithography process followed by an etching process. Further, the area of the first type doped semiconductor layer 110a which is exposed by the contact through hole C is smaller than the area of the first type doped semiconductor layer 110a which is occupied by the semiconductor mesa M.

In one of exemplary embodiments of this disclosure, the electrode layer 120', the support layer 130', the second type doped semiconductor layer 110c', and the light-emitting layer 110b' in the same semiconductor mesa M have substantially the same outer contour when viewing from atop. For example, since the electrode layer 120', the support layer 130', the second type doped semiconductor layer 110c', and the light-emitting layer 110b' are patterned by the same patterning process, the electrode layer 120', the support layer 130', the second type doped semiconductor layer 110c', and the light-emitting layer 110b' in each of the plurality of semiconductor mesas M may have substantially the same pattern when viewing from atop.

Referring to FIG. 3, after the aforementioned patterning process, the first type doped semiconductor layer 110a, the patterned light-emitting layer 110b', and the patterned second type doped semiconductor layer 110c' constitute the patterned epitaxial layer 110'. And, the epitaxial layer 110' distributed on the substrate 100 is covered by the electrode layer 120' and the support layer 130'. Since the support layer 130' and the patterned light-emitting layer 110b' as well as the patterned second type doped semiconductor layer 110c' are patterned by the patterning process, the support layer 130', the patterned light-emitting layer 110b', and the patterned second type doped semiconductor layer 110c' may have a same outer contour when viewing from atop.

Figure 4:
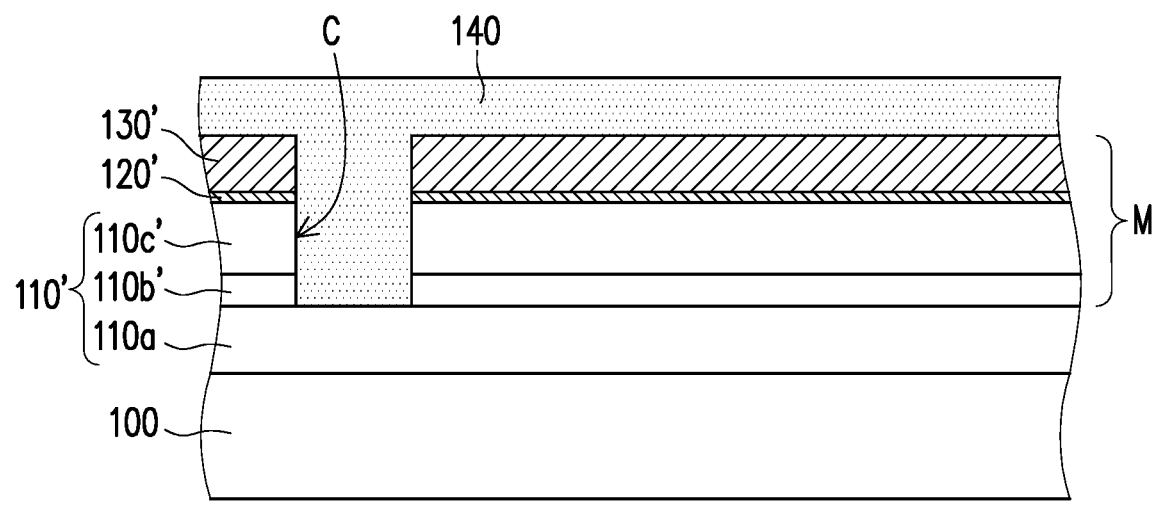

Referring to FIG. 4, after forming the semiconductor mesas M, an insulating layer 140 is formed on the semiconductor mesas M and a part of the first type doped semiconductor layer 110a that is not covered by the semiconductor mesas M. The insulating layer 140 covers the upper surface of the semiconductor mesas M, and the contact through hole C is filled with the insulating layer 140. In one of exemplary embodiments of this disclosure, the insulating layer 140 fills up the contact through hole C. The insulating layer 140 has a substantially flat upper surface, and the level height of the upper surface of the insulating layer 140 is higher than the level height of the upper surface of the support layer 130'.

Figure 5:
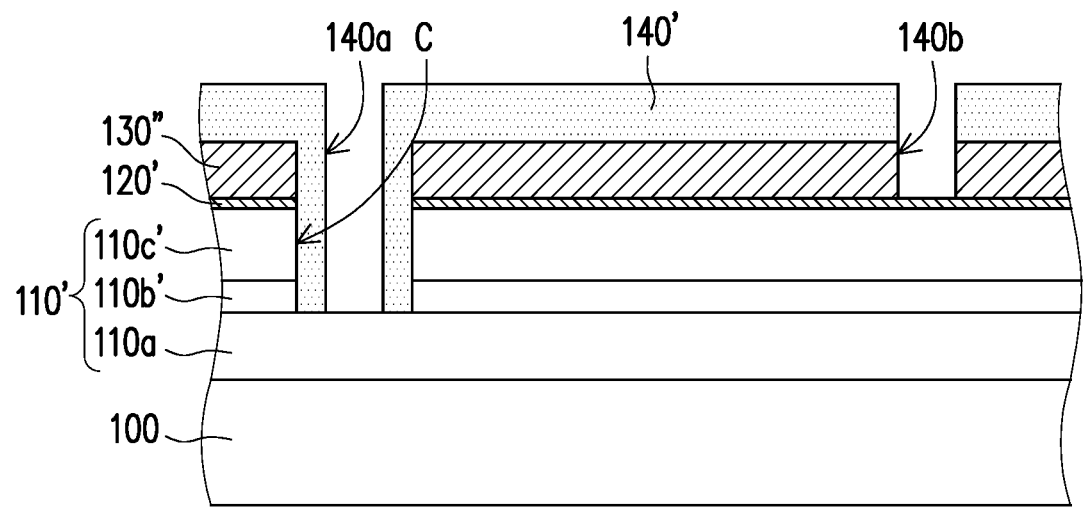

Referring to FIG. 4 and FIG. 5, the insulating layer 140 and the support layer 130' are patterned to form an insulating layer 140' and a support layer 130''. A through hole 140a penetrates through the insulating layer 140' and extends in the contact through hole C to expose a partial area of the first type doped semiconductor layer 110a. A through hole 140b penetrates through the insulating layer 140' and the support layer 130'' located above the epitaxial layer 110' to expose a partial area of the electrode layer 120'.

Figure 6:
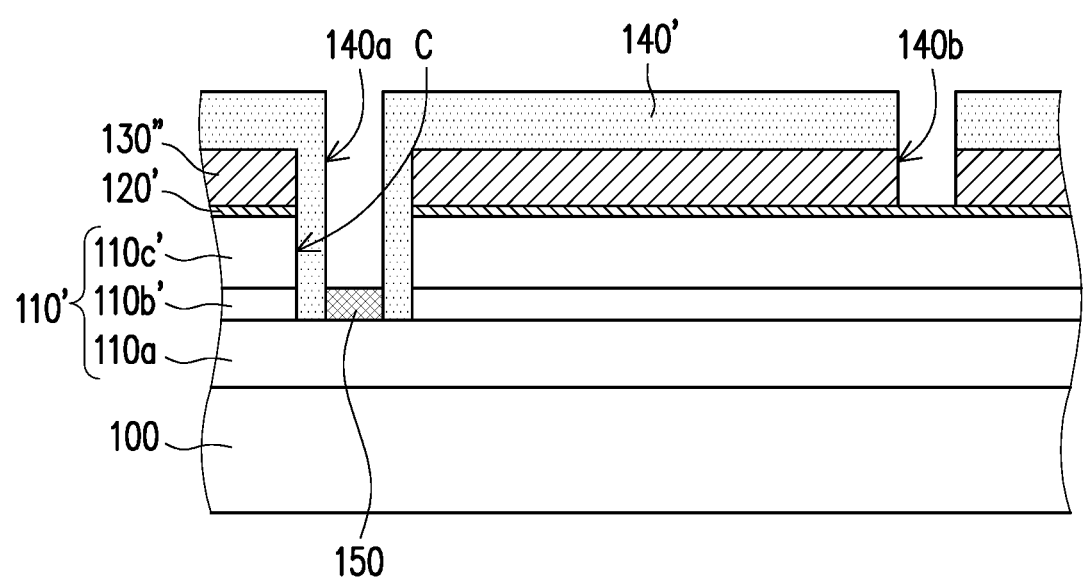

Referring to FIG. 6, an electrode layer 150 covering a partial area of the first type doped semiconductor layer 110a is formed in the through hole 140a. The electrode layer 150 is disposed at the bottom of the through hole 140a and a good ohmic contact is formed between the electrode layer 150 and the first type doped semiconductor layer 110a. For example, the material of the electrode layer 150 includes aluminium, silver titanium, gold, gold germanium, nickel, etc. The method of forming the electrode layer 150 may include chemical vapor deposition, physical vapor deposition, sputtering, electroless plating, chemical plating, etc.

Figure 7:
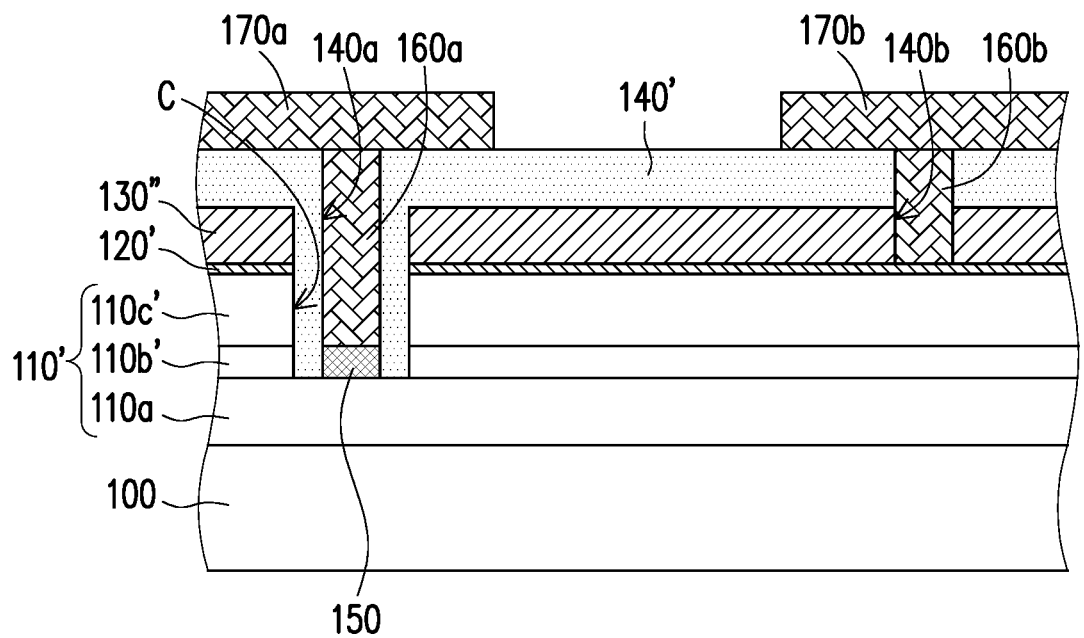

Referring to FIG. 6 and FIG. 7, a first conductive pillar 160a and a second conductive pillar 160b are formed in the through hole 140a and the through hole 140b, respectively. A first electrode pad 170a covering the first conductive pillar 160a and a second electrode pad 170b covering the second conductive pillar 160b are formed on the insulating layer 140'. The first electrode pad 170a is electrically connected to the electrode layer 150 by the first conductive pillar 160a penetrating through the insulating layer 140'. The second electrode pad 170b is electrically connected to the electrode layer 120' by the second conductive pillar 160b penetrating through the insulating layer 140' and the support layer 130''. In the present embodiment, the first conductive pillar 160a and the second conductive pillar 160b include metal conductive pillars, and the first electrode pad 170a and the second electrode pad 170b include metal electrode pads.

Referring to FIG. 7, the electrode layer 120' and the support layer 130'' are stacked on the upper surface of the second type doped semiconductor layer 110c' and interposed between the second type doped semiconductor layer 110c' and the patterned insulating layer 140'. The first conductive pillar 160a and the first electrode pad 170a are insulated from the electrode layer 120', the light-emitting layer 110b', and the second type doped semiconductor layer 110c' by the insulating layer 140'. The first conductive pillar 160a and the second conductive pillar 160b are insulated from each other by the insulating layer 140'. The first electrode pad 170a and the second electrode pad 170b are insulated from each other by the insulating layer 140'. Further, the first electrode pad 170a and the second electrode pad 170b are disposed on the same side of the epitaxial layer 110', and the first electrode pad 170a and the second electrode pad 170b are distributed at the same level height.

Referring to FIG. 7, the support layer 130" is in contact with the sidewall of the second conductive pillar 160b, but the support layer 130" is not in contact with the sidewall of the first conductive pillar 160a.

Figure 8:
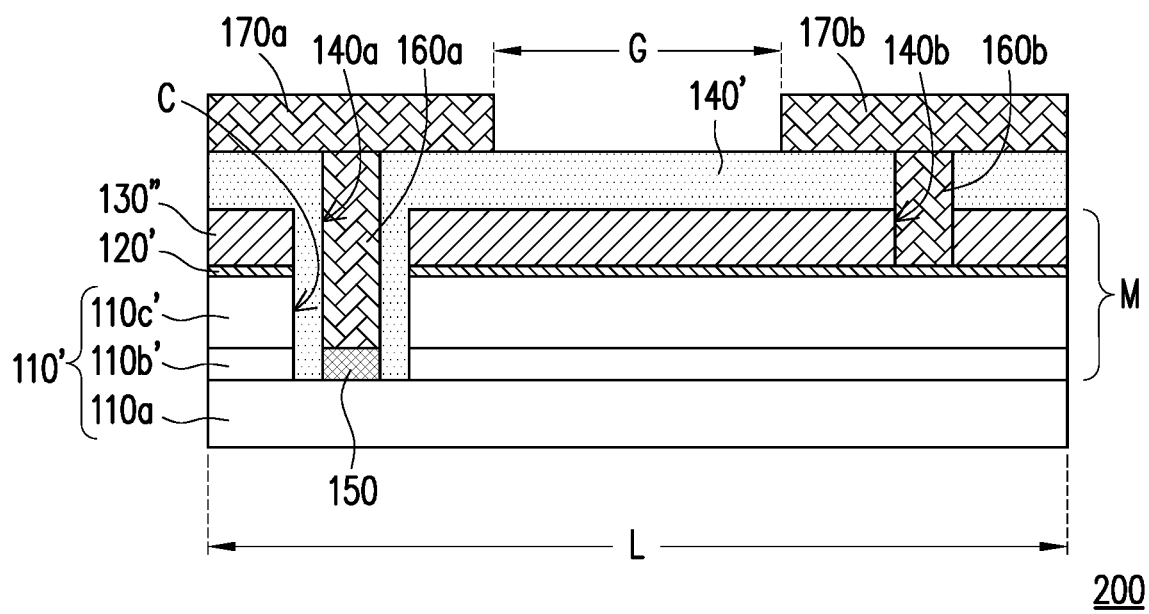
Figure 9:
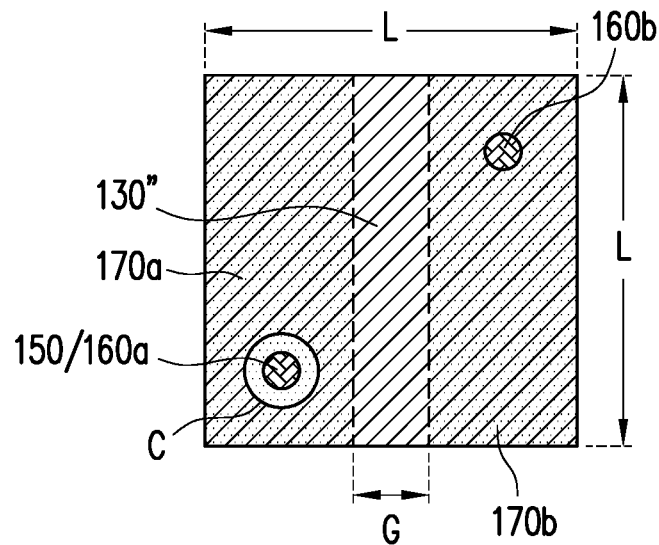
FIG. 9 is a schematic diagram illustrating a top view of the light-emitting device shown in FIG. 8.

Referring to FIG. 7 and FIG. 8, after the fabrication of the first electrode pad 170a and the second electrode pad 170b is performed, a lift-off process of the substrate 100 and a singulation process are performed to form a plurality of singulated light-emitting devices 200.

Only one of the singulated light-emitting devices 200 is illustrated in FIG. 8.

Referring to FIG. 8, the singulated light-emitting device 200 includes the epitaxial layer 110', the electrode layer 120', the support layer 130", the insulating layer 140', the electrode layer 150, the first conductive pillar 160a, the second conductive pillar 160b, the first electrode pad 170a, and the second electrode pad 170b. The electrode layer 120' and the support layer 130" cover the second type doped semiconductor layer 110c'. The insulating layer 140' covers the epitaxial layer 110', the electrode layer 120', and the support layer 130". The first electrode pad 170a and the second electrode pad 170b are disposed on the insulating layer 140'. The first electrode pad 170a is electrically connected to the first type doped semiconductor layer 110a by the first conductive pillar 160a and the electrode layer 150. The second electrode pad 170b is electrically connected to the second type doped semiconductor layer 110c' by the second conductive pillar 160b and the electrode layer 120'. The support layer 130" laterally or horizontally extends from a first position below the first electrode pad 170a to a second position below the second electrode pad 170b. Here, the support layer 130" laterally or horizontally extends from the first position below the first electrode pad 170a to the second position below the second electrode pad 170b means that the support layer 130" partially overlaps the first electrode pad 170a and the second electrode pad 170b in the vertical direction.

In the first embodiment, as shown in FIG. 8 and FIG. 9, the light-emitting device 200 is a substrate-less light-emitting diode (LED) chip. The light-emitting device 200 is, for example, a micron-scale LED chip having a thickness ranging from 3 micrometers to 40 micrometers. The light-emitting device 200 is, for example, a square-shaped micron-scale LED chip having a side length L of ranging from 10 micrometers to 100 micrometers. In one of exemplary embodiments of this disclosure, as the side length L of the light-emitting device 200 increases from 10 micrometers to 100 micrometers, the thickness of the support layer 130" may increase from 0.1 micrometer to 30 micrometers.

In one of exemplary embodiments of this disclosure, as the side length L of the light-emitting device 200 increases from 10 micrometers to 100 micrometers, the gap G between the first electrode pad 170a and the second electrode pad 170b ranges from 3 micrometers to 80 micrometers. In an embodiment shown in FIG. 8, the light-emitting device 200 is a square-shaped micron-scale LED chip having the side length L between 10 micrometers and 100 micrometers, and the gap G between the first electrode pad 170a and the second electrode pad 170b can be 0.8 L or slightly lower than 0.8 L.

According to the aforementioned, in one of exemplary embodiments of this disclosure, the thickness of the support layer 130" increases as the gap G between the first electrode pad 170a and the second electrode pad 170b increases.

Figure 10:
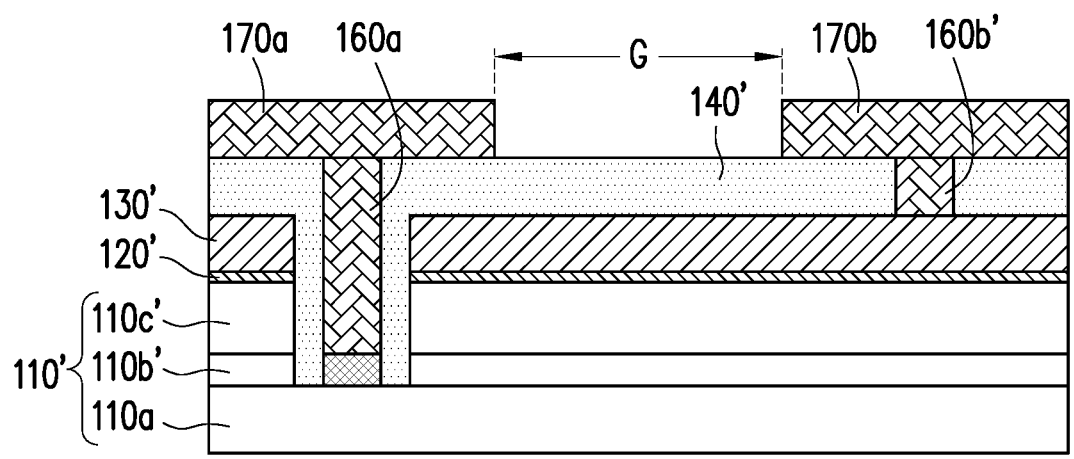
FIG. 10 is a cross-sectional view illustrating a light-emitting device according to a second embodiment of this disclosure.

FIG. 10 is a cross-sectional view illustrating a light-emitting device according to a second embodiment of this disclosure. Referring to FIG. 4, FIG. 8, and FIG. 10, the light-emitting device 200a of the second embodiment is similar to the light-emitting device 200 illustrated in FIG. 8 except that the second conductive pillar 160b' does not penetrate through the support layer 130', and the second conductive pillar 160b' is not in direct contact with the electrode layer 120'. Further, in the light-emitting device 200a of the second embodiment, the support layer 130' may be made of a conductor material to ensure that the second electrode pad 170b can be electrically connected to the second type doped semiconductor layer 110c'.

Figure 11:
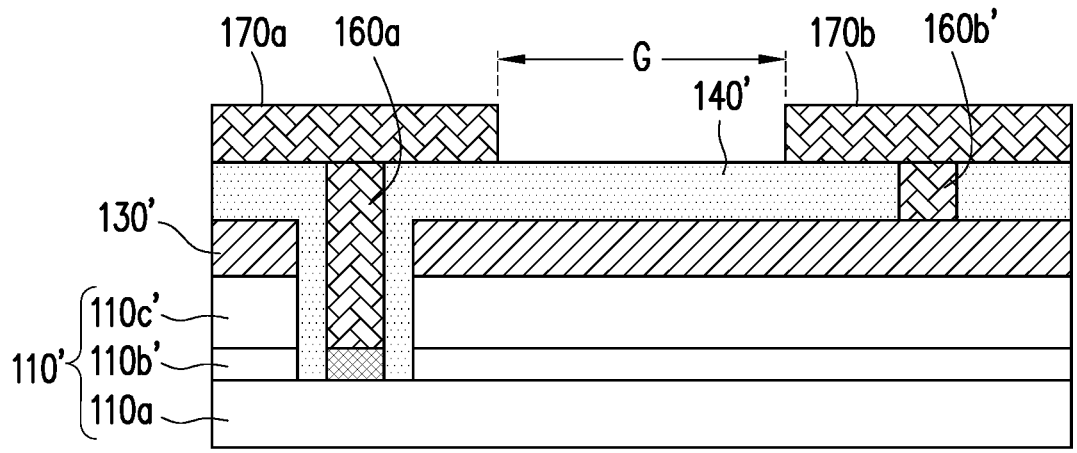
FIG. 11 is a cross-sectional view illustrating a light-emitting device according to a third embodiment of this disclosure.

FIG. 11 is a cross-sectional view illustrating a light-emitting device according to a third embodiment of this disclosure. Referring to FIG. 10 and FIG. 11, the light-emitting device 200b of the third embodiment is similar to the light-emitting device 200a of FIG. 10 except that the light-emitting device 200b does not include the electrode layer 120', and the support layer 130' is in direct contact with the second type doped semiconductor layer 110c'. In the light-emitting device 200b of the present embodiment, a good ohmic contact is formed between the support layer 130' and the second type doped semiconductor layer 110c'.

Figure 12:
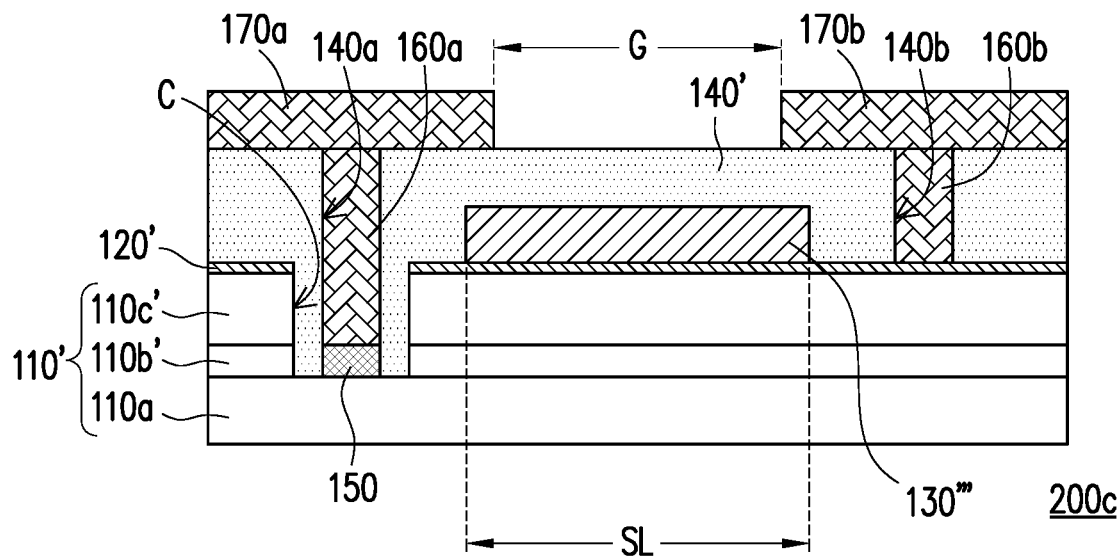
FIG. 12 is a cross-sectional view illustrating a light-emitting device according to a fourth embodiment of this disclosure.
Figure 13:
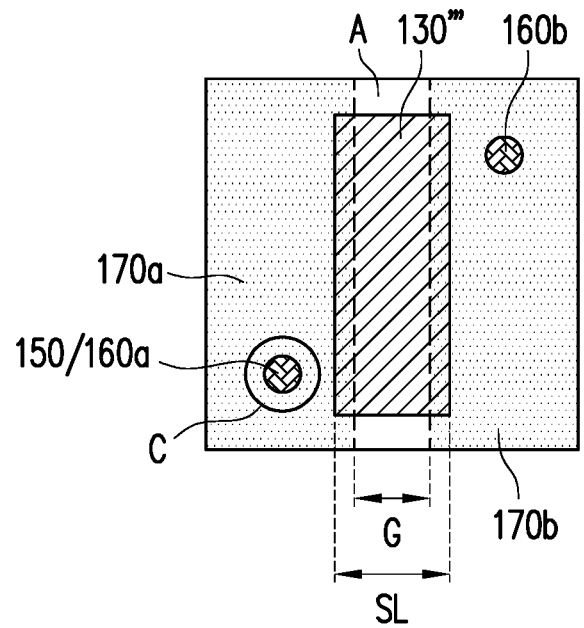
FIG. 13 is a schematic diagram illustrating a top view of the light-emitting device shown in FIG. 12.
Figure 14:
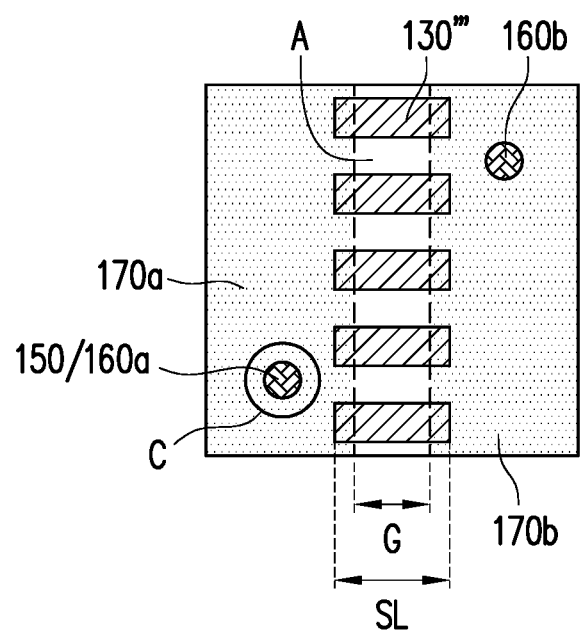
FIG. 14 is a schematic diagram illustrating another top view of the light-emitting device shown in FIG. 12.

FIG. 12 is a cross-sectional view illustrating a light-emitting device according to a fourth embodiment of this disclosure. FIG. 13 is a schematic diagram illustrating a top view of the light-emitting device shown in FIG. 12. FIG. 14 is a schematic diagram illustrating another top view of the light-emitting device shown in FIG. 12. Referring to FIG. 8 and FIG. 12 through FIG. 14, the light-emitting device 200c of the fourth embodiment is similar to the light-emitting device 200 of FIG. 8 except that the support layer 130''' of the light-emitting device 200c may include a single bulk pattern (as shown in FIG. 13) or a plurality of paralleled stripe patterns separated from each other (as shown in FIG. 14). The support layer 130''' extends from the first position below the first electrode pad 170a to the second position below the second electrode pad 170b to partially cover a single or a plurality of partial areas of the epitaxial layer 110. In the fourth embodiment, the support layer 130''' is not in contact with the first conductive pillar 160a and the second conductive pillar 160b.

As shown in FIG. 12 and FIG. 13, a horizontal extension length SL of the support layer 130''' is greater than the gap G between the first electrode pad 170a and the second electrode pad 170b. The area occupied by the support layer 130''' is, for example, at least (i.e. great than or equal to) 20% of an area A between the first electrode pad 170a and the second electrode pad 170b. As shown in FIG. 13, the area A is an area between the inner edge of the first electrode pad 170a and the inner edge of the second electrode pad 170b. In one of exemplary embodiments of this disclosure, the area occupied by the support layer 130''' ranges, for example, from 20% to 100% of the area A between the first electrode pad 170a and the second electrode pad 170b.

As shown in FIG. 14, the horizontal extension length SL of the support layer 130''' is greater than the gap G between the first electrode pad 170a and the second electrode pad 170b. The sum of the areas occupied by the support layer 130''' is, for example, at least (i.e. greater than or equal to) 20% of the area A between the first electrode pad 170a and the second electrode pad 170b. In one of exemplary embodiments of this disclosure, the sum of the areas occupied by the support layer 130''' ranges, for example, from 20% to 100% of the area A between the first electrode pad 170a and the second electrode pad 170b.

In an embodiment in which the side length L of the light-emitting device is 30 micrometers and the gap G between the first electrode pad 170a and the second electrode pad 170b is 18 micrometers, in order to maintain an approximate structural strength, the minimum thickness of the support layer 130''' increases as the area ratio of the sum of the areas occupied by the support layer 130''' to the area A reduces. The following table illustrates the relationship between the minimum thickness of the support layer 130''' and the area ratio of the sum of the areas occupied by the support layer 130''' to the area A.

| chip size (μm) | | 30 | |
|---|---|---|---|
| gap between the electrode pads (μm) | | 18 | |
| thickness of the support layer (μm) | 4.5 | 5.8 | 10 |
| sum of the areas occupied by the support layer/area between the electrode pads | 67% | 40% | 25% |

Figure 15:
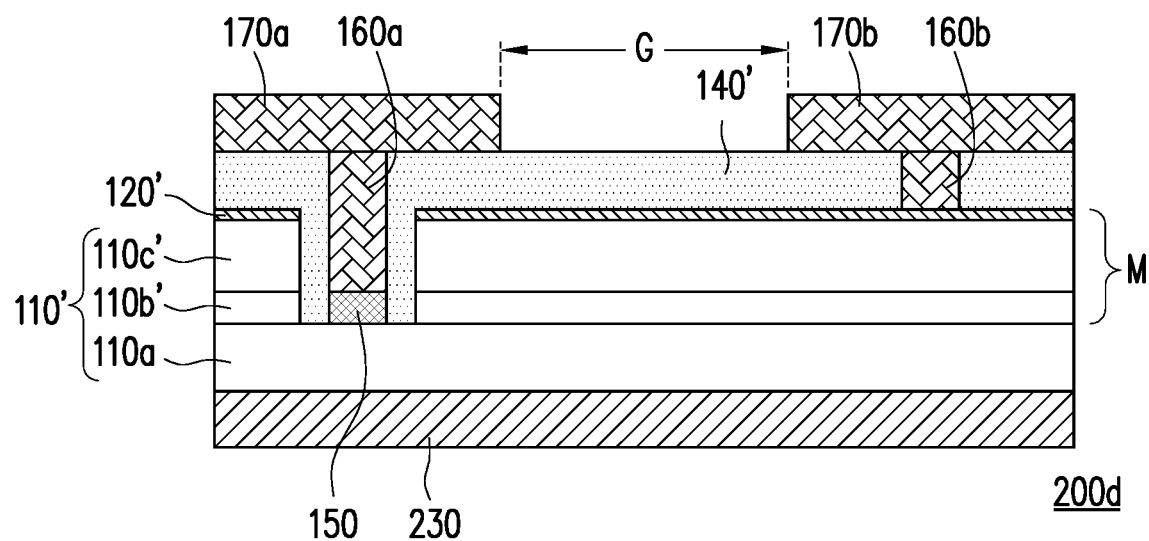
FIG. 15 is a cross-sectional view illustrating a light-emitting device according to a fifth embodiment of this disclosure.

FIG. 15 is a cross-sectional view illustrating a light-emitting device according to a fifth embodiment of this disclosure. Referring to FIG. 15, the light-emitting device 200d of the fifth embodiment is similar to the light-emitting device 200 of FIG. 8 except that the semiconductor mesa M of the light-emitting device 200d does not include the support layer, the light-emitting layer 110b' and the second type doped semiconductor layer 110c' are disposed on the upper surface of the first type doped semiconductor layer 110a, and the support layer 230 is disposed on the lower surface of the first type doped semiconductor layer 110a. In other words, the light-emitting layer 110b' and the second type doped semiconductor layer 110c' are disposed on one side (for example, on the first surface) of the first type doped semiconductor layer 110a, and the support layer 230 is disposed on the other side (for example, on the second surface) of the first type doped semiconductor layer 110a.

As shown in FIG. 15, the support layer 230 entirely covers the lower surface of the first type doped semiconductor layer 110a, the electrode layer 120' is disposed on the second type doped semiconductor layer 110c', and the electrode layer 120' is disposed between the second type doped semiconductor layer 110c' and the insulating layer 140'.

Figure 16:
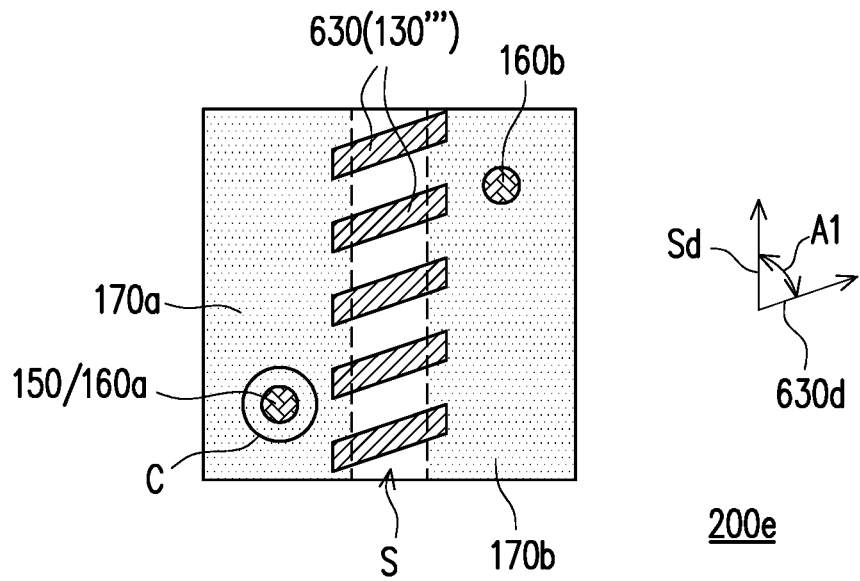
FIG. 16 is a schematic diagram illustrating a top view of the light-emitting device according to a sixth embodiment of this disclosure.

FIG. 16 is a schematic diagram illustrating a top view of the light-emitting device according to a sixth embodiment of this disclosure. Referring to FIG. 12, FIG. 14, and FIG. 16, the light-emitting device 200e of the sixth embodiment is similar to the light-emitting device 200c illustrated in FIG. 12 or another embodiment thereof (as shown in FIG. 14) except that the space S between the first electrode pad 170a and the second electrode pad 170b has a first extension direction Sd, and a plurality of stripe patterns 630 (a type of bulk pattern) of the support layer 130''' separated from each other has a second extension direction 630d. The included angle A1 between the first extension direction Sd and the second extension direction 630d is greater than or equal to 20°, and the included angle A1 between the first extension direction Sd and the second extension direction 630d is less than or equal to 90°.

Figure 17:
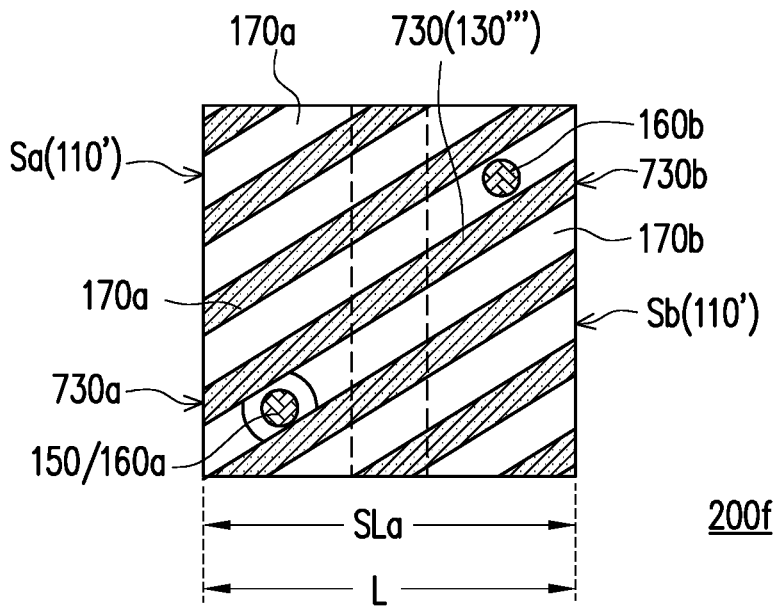
FIG. 17 is a schematic diagram illustrating a top view of the light-emitting device according to a seventh embodiment of this disclosure.

FIG. 17 is a schematic diagram illustrating a top view of the light-emitting device according to a seventh embodiment of this disclosure. Referring to FIG. 16 and FIG. 17, the light-emitting device 200f of the seventh embodiment is similar to the light-emitting device 200e illustrated in FIG. 16 except that at least one end of the stripe pattern 730 of the support layer 130''' may be close to at least one side surface of the epitaxial layer 110'. A plurality of stripe patterns 730 may be separated from each other, but the disclosure is not limited thereto.

For example, the stripe pattern 730 includes a first end 730a and a second end 730b opposite to each other. The first end 730a may be close to one side surface Sa of the epitaxial layer 110'. The second end 730b may be close to the other side surface Sb of the epitaxial layer 110'. In the embodiment, the first end 730a may be aligned with the side surface Sa of the epitaxial layer 110' or the edge of the first electrode pad 170a, but the disclosure is not limited thereto. In the embodiment, the second end 730b may be aligned with the other side surface Sb of the epitaxial layer 110' or the edge of the second electrode pad 170b, but the disclosure is not limited thereto. In the embodiment, the maximum lateral extension length SLa of the support layer 130' may be the same as the side length L of the light-emitting device, but the disclosure is not limited thereto.

Figure 18:
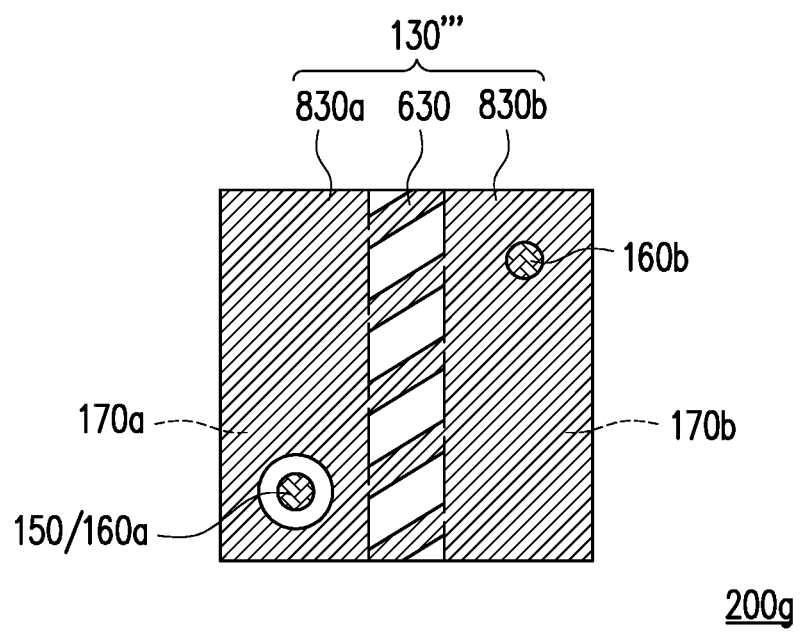
FIG. 18 is a schematic diagram illustrating a top view of the light-emitting device according to an eighth embodiment of this disclosure.

FIG. 18 is a schematic diagram illustrating a top view of the light-emitting device according to an eighth embodiment of this disclosure. Referring to FIG. 16 and FIG. 18, the light-emitting device 200g of the eighth embodiment is similar to the light-emitting device 200e illustrated in FIG. 16 except that the support layer 130''' may further include a block pattern 830a disposed on the first electrode pad 170a or a block pattern 830b disposed on the second electrode pad 170b. The block pattern 830a may be connected to the stripe patterns 630; or the block pattern 830b may be connected to the stripe patterns 630.

Figure 19:
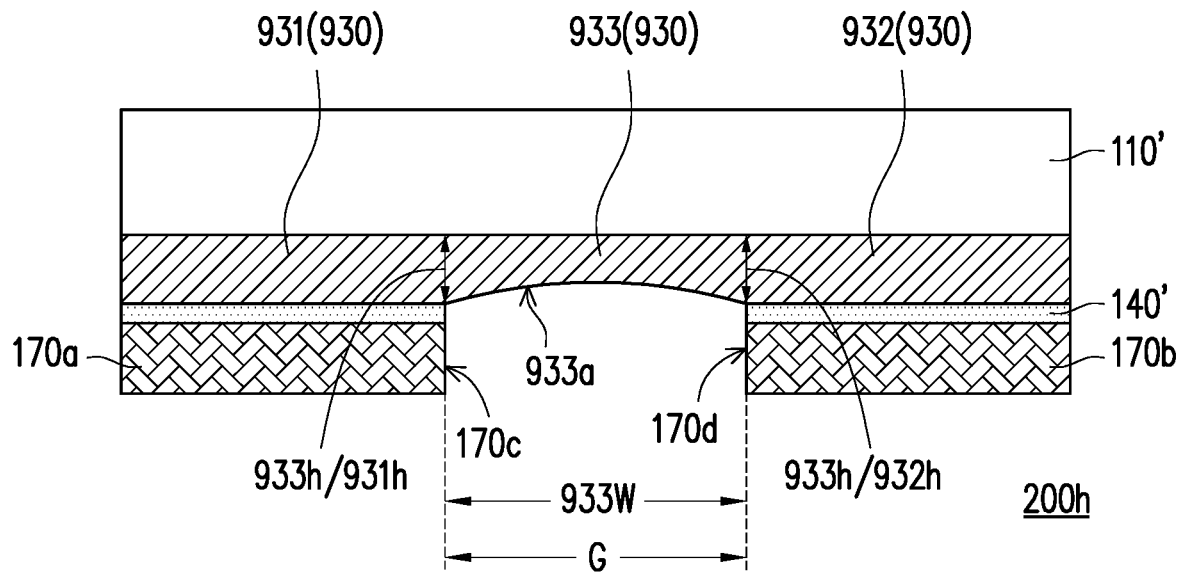
FIG. 19 is a cross-sectional view illustrating a light-emitting device according to a ninth embodiment of this disclosure.

FIG. 19 is a cross-sectional view illustrating a light-emitting device according to a ninth embodiment of this disclosure. Referring to FIG. 16 and FIG. 19, the light-emitting device 200h of the ninth embodiment is similar to the light-emitting device 200e illustrated in FIG. 16 except that the support layer 930 has a concave area 933. The concave direction of the concave area 933 faces the epitaxial layer 110'. The first electrode pad 170a and the second electrode pad 170b cover at least a part of an area outside the concave area 933.

For example, the support layer 930 includes a first area 931, a second area 932, and a concave area 933 located between the first area 931 and the second area 932. The first electrode pad 170a covers the first area 931. The second electrode pad 170b covers the second area 932. The outer surface 933a of the concave area 933 away from the epitaxial layer 110' may be recessed inward the epitaxial layer 110'.

In the embodiment, the normal vector to the outer surface 933a of the concave areas 933 at any position thereof is not parallel to the normal vector to the sidewall 170c of the first electrode pad 170a or the side wall 170d of the second electrode pad 170b.

In the embodiment, the width 933w of the concave area 933 may be substantially equal to the gap G between the first electrode pad 170a and the second electrode pad 170b. A portion of the concave area 933 having the maximum thickness 933h may correspond to the sidewall 170c of the first electrode pad 170a and/or the sidewall 170d of the second electrode pad 170b. The maximum thickness 933h of the concave area 933 is substantially the same as the thickness 931h at the first area 931 connected thereto or the thickness 932h at the second area 932 connected thereto.

In the embodiment, the outer surface 933a of the concave area 933 may include a curved surface, but the disclosure is not limited thereto.

Figure 20:
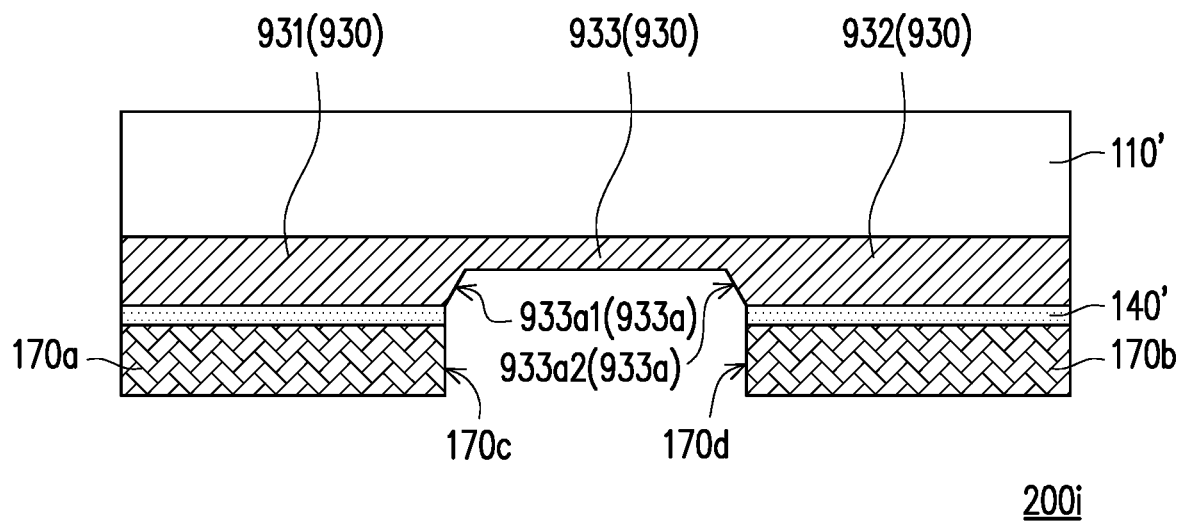
FIG. 20 is a cross-sectional view illustrating a light-emitting device according to a tenth embodiment of this disclosure.

FIG. 20 is a cross-sectional view illustrating a light-emitting device according to a tenth embodiment of this disclosure. Referring to FIG. 19 and FIG. 20, the light-emitting device 200i of the tenth embodiment is similar to the light-emitting device 200h illustrated in FIG. 19 except that the outer surface 933a of the concave area 933 may include an inclined surface 933a1 or an inclined surface 933a2. The inclined surface 933a1 may extend inwardly from a position corresponding to the sidewall 170c of the first electrode pad 170a toward the epitaxial layer 100'; or the inclined surface 933a2 may extend inwardly from a position corresponding to the sidewall 170d of the second electrode pad 170b toward the epitaxial layer 100'.

Figure 21:
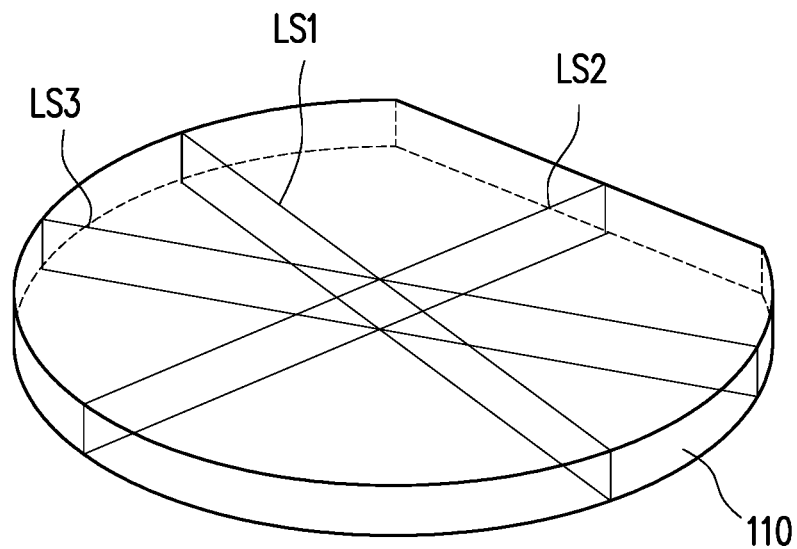
FIG. 21 is a partial perspective view illustrating a part of the manufacturing process of a light-emitting device according to an embodiment of this disclosure.
Figure 22:
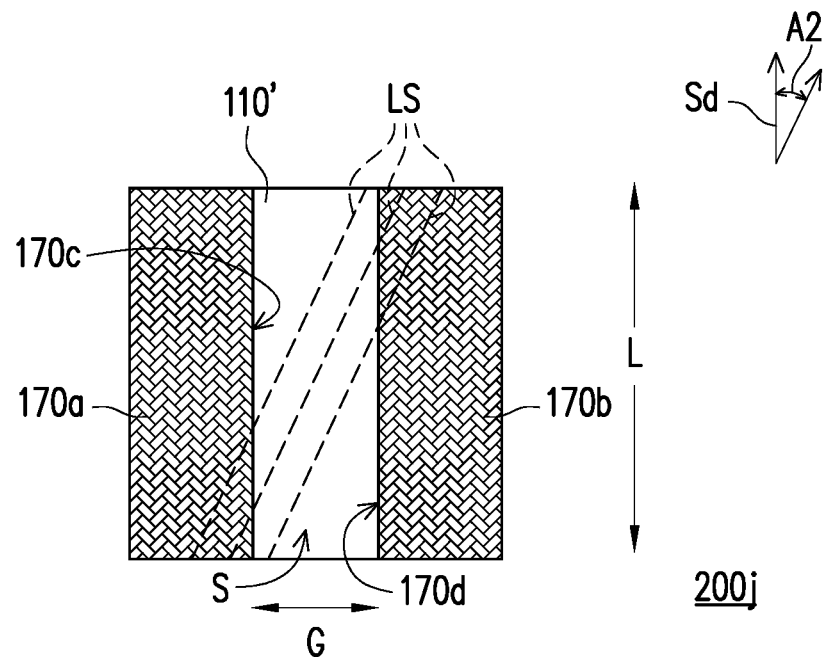
FIG. 22 is a schematic diagram illustrating a top view of the light-emitting device according to an eleventh embodiment of this disclosure.

FIG. 21 is a partial perspective view illustrating a part of the manufacturing process of a light-emitting device according to an embodiment of this disclosure. FIG. 22 is a schematic diagram illustrating a top view of the light-emitting device according to an eleventh embodiment of this disclosure. In addition, for clarity, some of the film layers may be omitted in FIG. 21 or FIG. 22. For example, the structure as shown in a perspective view of FIG. 21 may be similar to the structure as shown in FIG. 1, but for clarity, only the epitaxial layer 110 is shown in FIG. 21. For example, the cross-section view of the structure as shown in FIG. 22 may be similar to the cross-section view of the structure as shown in FIG. 8, FIG. 10, FIG. 11, FIG. 12, FIG. 15, FIG. 19, or FIG. 20, but for clarity, only the epitaxial layer 110', the first electrode pad 170a, and the second electrode pad 170b are shown in FIG. 22.

In the embodiment, the epitaxial layer 110 may define a plurality of lattice planes (or, lattice surfaces) LS1, LS2, LS3 with corresponding directions according to the orientation of the unit cell thereof. In the embodiment, the epitaxial layer 110 may have a first lattice plane LS1, a second lattice plane LS2, and a third lattice plane LS3. In an embodiment, compared to other lattice planes, the atoms located on opposite sides of the first lattice plane LS1 and/or the second lattice plane LS2 may be easier to separate or de-bond after being stressed. In other words, the epitaxial layer 110 may have a relatively smaller tolerable stress in the direction of the first lattice plane LS1 and/or the second lattice plane LS2. In an embodiment, the first lattice plane LS1 and/or the second lattice plane LS2 may be referred to as a cleavage plane. In an embodiment, the third lattice plane LS3 may also be a cleavage plane.

For example, the epitaxial layer includes a GaP layer, and the cleavage surface of the GaP layer is {110} plane.

For example, the epitaxial layer includes a GaN layer, and the cleavage surface of the GaN layer is {1$\bar{1}$00} plane.

In the embodiment, a light-emitting device 200j as shown in FIG. 22 may be formed by the same or similar processes as shown in FIGS. 2 to 8 and/or corresponding descriptions. In other words, the epitaxial layer 110' of the light-emitting device 200j may have a plurality of corresponding lattice planes LS. The orientation of the lattice plane LS may correspond to the first lattice plane LS1, the second lattice plane LS2, and/or the third lattice plane LS3.

In the embodiment, in a simulation process of dicing the epitaxial layer 110', a plane of the epitaxial layer 110' parallel to the lattice plane LS thereof may overlap the first electrode pad 170a or the second electrode pad 170b.

In the embodiment, in a top view direction (e.g., a view direction similar to or as shown in FIG. 22, or a film stacking direction of the films for forming the epitaxial layer 110'), there is an included angle A2 between the lattice plane LS of the epitaxial layer 110' and the first extension direction Sd of the space S. In an embodiment, there are corresponding included angles between the first lattice plane LS1 and the first extension direction Sd of the space S, between the second lattice plane LS2 and the first extension direction Sd of the space S, and between the third lattice plane LS3 and the first extension direction Sd of the space S.

In the embodiment, in a top view direction, there may be a similar or corresponding included angle between the lattice plane LS of the epitaxial layer 110' and the sidewall 170c of the first electrode pad 170a; or there may be a similar or corresponding included angle between the lattice plane LS of the epitaxial layer 110' and the sidewall 170d of the second electrode pad 170b. In the embodiment, the extension direction of the sidewall 170c of the first electrode pad 170a or the extension direction of the sidewall 170d of the second electrode pad 170b is substantially parallel to the first extension direction Sd, but the disclosure is not limited thereto.

In the embodiment, the extension length of the space S is approximately the same as the side length L of the light-emitting device 200j, and the tangent value of the included angle A2 is greater than the quotient of the distance of the interval S (e.g., the gap G) divided by the side length L (e.g., $\tan(A2) > G/L$).

In an embodiment, the cross-section view of the light-emitting device 200j may be similar to the cross-section view of the structure as shown in FIG. 8, FIG. 10, FIG. 11, FIG. 12, FIG. 19, or FIG. 20. For example, the light-emitting device 200j may include a support layer (not shown) that is the same as or similar to the support layer 130', the support layer 130'', the support layer 130''' or the support layer 930. The aforementioned support layer covers the the second type doped semiconductor layer 110c', and the aforementioned support layer extends from a first position below the first electrode pad 170a to a second position below the second electrode pad 170b.

In an embodiment, the cross-section view of the light-emitting device 200j may be similar to the cross-section view of the structure as shown in FIG. 15. For example, the light-emitting device 200j may include a support layer (not shown) that is the same as or similar to the support layer 230. The aforementioned support layer covers the first type doped semiconductor layer 110a and is opposite to the light-emitting layer 110b', and the aforementioned support layer extends from a first position below the first electrode pad 170a to a second position below the second electrode pad 170b.

In the embodiment, when the light-emitting device 200j is transferred, the risk of damage to the light-emitting device 200j due to the stress may be reduced by the corresponding arrangement between the lattice plane LS and the first electrode pad 170a or between the lattice plane LS and the second electrode pad 170b.

Figure 23:
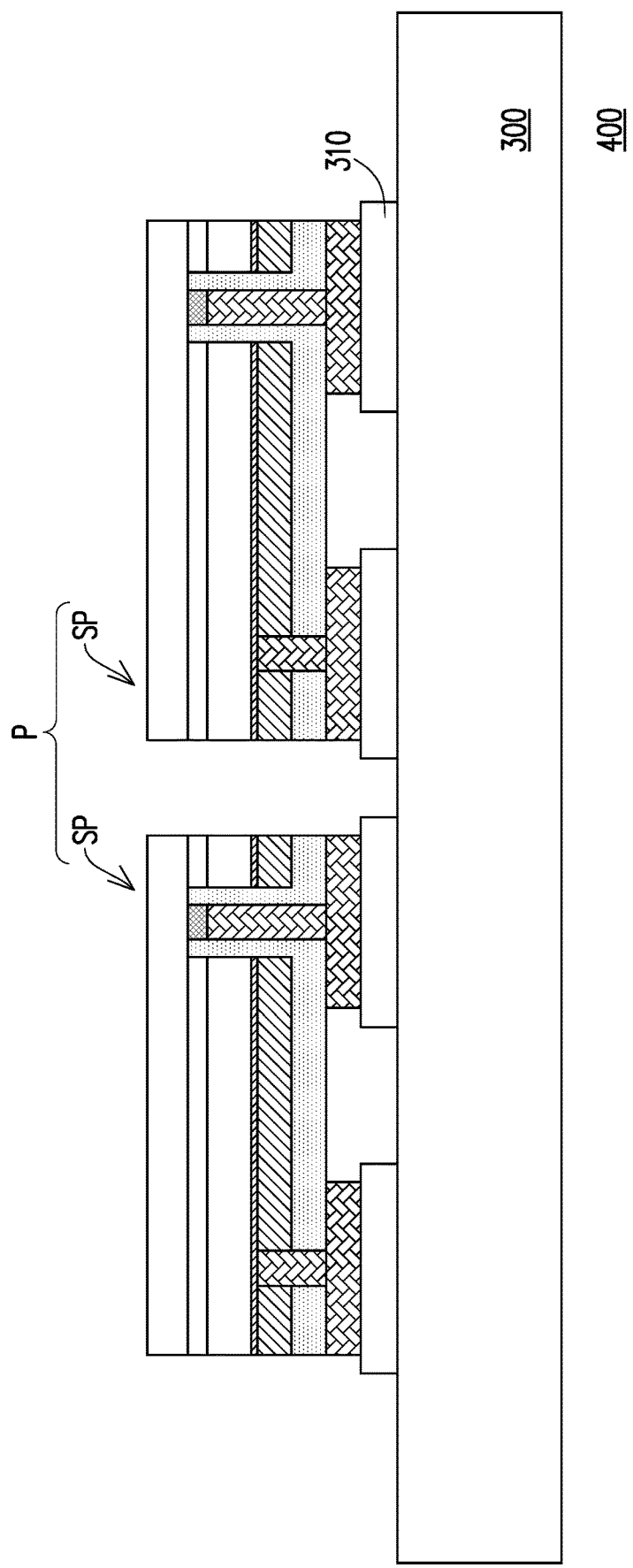
FIG. 23 is a cross-sectional view illustrating a display apparatus according to an embodiment of this disclosure.

FIG. 23 is a cross-sectional view illustrating a display apparatus according to an embodiment of this disclosure. Referring to FIG. 23, a display apparatus 400 of the present embodiment includes a driving backplate 300 and a plurality of display pixels P arranged in an array. The display pixels P are disposed on the driving backplate 300 and electrically connected to the electrode pads 310 of the driving backplate 300. Each of the display pixels P includes a plurality of sub-pixels SP. At least one sub-pixel among the sub-pixels SP includes the light-emitting device 200, 200a, 200b, 200c, 200d, 200e, 200f, 200g, 200h, 200i or 200j as shown in FIG. 8, FIG. 10, FIG. 11, FIG. 12, FIGS. 15 to 20, and FIG. 22. In one of exemplary embodiments of this disclosure, the display pixel P includes a sub-pixel capable of emitting red light, a sub-pixel capable of emitting green light, and a sub-pixel capable of emitting blue light, wherein the light-emitting device 200 illustrated in FIG. 8, the light-emitting device 200a illustrated in FIG. 10, the light-emitting device 200b illustrated in FIG. 11, the light-emitting device 200c illustrated in FIG. 12, the light-emitting device 200d illustrated in FIG. 15, the light-emitting device 200e illustrated in FIG. 16, the light-emitting device 200f illustrated in FIG. 17, the light-emitting device 200g illustrated in FIG. 18, the light-emitting device 200h illustrated in FIG. 19, the light-emitting device 200i illustrated in FIG. 20 or the light-emitting device 200j illustrated in FIG. 22 may be used as the sub-pixel capable of emitting red light, and the sub-pixel capable of emitting green light and the sub-pixel capable of emitting blue light may include no support layer. In other embodiments of this disclosure, the light-emitting device 200 illustrated in FIG. 8, the light-emitting device 200a illustrated in FIG. 10, the light-emitting device 200b illustrated in FIG. 11, the light-emitting device 200c illustrated in FIG. 12, the light-emitting device 200d illustrated in FIG. 15, the light-emitting device 200e illustrated in FIG. 16, the light-emitting device 200f illustrated in FIG. 17, the light-emitting device 200g illustrated in FIG. 18, the light-emitting device 200h illustrated in FIG. 19, the light-emitting device 200i illustrated in FIG. 20 or the light-emitting device 200j illustrated in FIG. 22 may be used as the sub-pixel capable of emitting red light, the sub-pixel capable of emitting green light, or the sub-pixel capable of emitting blue light.

In summary, the light-emitting device having the support layer or the epitaxial layer with a specific configuration orientation in accordance with the present disclosure can increase the manufacturing yield. In addition, when transferring the light-emitting device to the driving backplate, the support layer or the epitaxial layer with a specific configuration orientation reduces the crack risk of the light-emitting device resulted from stress, thereby improving the yield rate of the bonding between the light-emitting device and the driving backplate.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A light-emitting device, comprising:
   an epitaxial layer, comprising a first type doped semiconductor layer, a light-emitting layer and a second type doped semiconductor layer, wherein the light-emitting layer is disposed on a partial area of the first type doped semiconductor layer and is between the first type doped semiconductor layer and the second type doped semiconductor layer;
   a support layer, covering the second type doped semiconductor layer and having an outer surface opposite to the epitaxial layer, wherein the support layer comprises a first area, a second area, and a concave area disposed between the first area and the second area, and a portion of the outer surface corresponding to the concave area recessed inward the epitaxial layer;
   an insulating layer, covering the epitaxial layer and the support layer;
   a first electrode pad, disposed on the first area; and
   a second electrode pad, disposed on the second area, wherein:
   the first electrode pad and the second electrode pad are disposed on the insulating layer;
   the first electrode pad and the second electrode pad are electrically connected to the first type doped semiconductor layer and the second type doped semiconductor layer, respectively;
   the support layer extends from a first position below the first electrode pad to a second position below the second electrode pad;
   in a thickness direction of the support layer, the concave area does not overlap the first electrode pad and the second electrode pad; and
   in a top view of the light-emitting device, the support layer comprises a plurality of stripe patterns separated from each other, an extension length of each of the plurality of stripe patterns is greater than a gap between the first electrode pad and the second electrode pad.

2. The light-emitting device according to claim 1, wherein the support layer, the second type doped semiconductor layer and the light-emitting layer have a same outer contour when viewing from atop.

3. The light-emitting device according to claim 1, wherein the support layer, the second type doped semiconductor layer and the light-emitting layer have a same pattern when viewing from atop.

4. The light-emitting device according to claim 1, wherein a normal vector to a outer surface of the concave area is not parallel to a normal vector to a sidewall of the first electrode pad or a sidewall of the second electrode pad.

5. The light-emitting device according to claim 1, wherein the support layer comprises a bulk pattern, and the bulk pattern extends from the first position below the first electrode pad to the second position below the second electrode pad to cover a partial area of the epitaxial layer.

6. The light-emitting device according to claim 1, wherein the support layer comprises a plurality of stripe patterns separated from each other, and the plurality of stripe patterns respectively extend from the first position below the first electrode pad to the second position below the second electrode pad to respectively cover a plurality of partial areas of the epitaxial layer.

7. The light-emitting device according to claim 6, wherein a space between the first electrode pad and the second electrode pad has a first extension direction, the plurality of stripe patterns have a second extension direction, and an included angle between the first extension direction and the second extension directions is greater than or equal to 20° and less than or equal to 90°.

8. The light-emitting device according to claim 1, wherein the support layer is disposed on the same level height, and the support layer does not cover a side surface of the epitaxial layer.

9. The light-emitting device according to claim 1, wherein the first electrode pad and the second electrode pad are disposed at a same level height.

10. The light-emitting device according to claim 1, further comprising:
    an electrode layer, disposed on the second type doped semiconductor layer and between the second type doped semiconductor layer and the insulating layer.

11. The light-emitting device according to claim 1, wherein a sum of the areas occupied by the support layer is at least 20% of the area between the first electrode pad and the second electrode pad.

12. The light-emitting device according to claim 1, further comprising:
- a first conductive pillar, penetrating through the insulating layer and electrically connected to the first type doped semiconductor layer; and
- a second conductive pillar, penetrating through at least the insulating layer and electrically connected to the second type doped semiconductor layer.

13. The light-emitting device according to claim 12, wherein the support layer is a dielectric layer, and the second conductive pillar penetrates through the insulating layer and the support layer is electrically connected to the second type doped semiconductor layer.

14. The light-emitting device according to claim 12, wherein the support layer is a conductive layer, and the second conductive pillar penetrates through the insulating layer and is electrically connected to the second type doped semiconductor layer by the support layer.

15. The light-emitting device according to claim 1 is a substrate-less light-emitting diode chip.

16. A light-emitting device, comprising:
- an epitaxial layer, comprising a first type doped semiconductor layer, a light-emitting layer and a second type doped semiconductor layer, wherein the light-emitting layer is disposed on a partial area of the first type doped semiconductor layer and is between the first type doped semiconductor layer and the second type doped semiconductor layer;
- an insulating layer, covering the epitaxial layer;
- a support layer;
- a first electrode pad; and
- a second electrode pad,
  - wherein the first electrode pad and the second electrode pad are disposed on the insulating layer, and the first electrode pad and the second electrode pad are electrically connected to the first type doped semiconductor layer and the second type doped semiconductor layer, respectively,
  - wherein there is an included angle between a cleavage surface of the epitaxial layer and a sidewall of the first electrode pad or a sidewall of the second electrode pad, wherein the cleavage surface of the epitaxial layer corresponds to a cleavage plane of a unit cell of a material forming the epitaxial layer, wherein the cleavage plane is the one that withstand the smallest stress among all lattice surfaces of the unit cell,
  - wherein in a top view of the light-emitting device, the support layer comprises a plurality of stripe patterns separated from each other, an extension length of each of the plurality of stripe patterns is greater than a gap between the first electrode pad and the second electrode pad.

17. The light-emitting device according to claim 16, a plane of the epitaxial layer parallel to the cleavage surface overlaps the first electrode pad or the second electrode pad.

18. The light-emitting device according to claim 16, the epitaxial layer includes a GaP layer, and the cleavage surface is a {110} plane of the GaP layer.

19. The light-emitting device according to claim 16, the epitaxial layer includes a GaN layer, and the cleavage surface is a {1$\bar{1}$00} plane of the GaN layer.

20. The light-emitting device according to claim 16, wherein:
- the support layer covers the second type doped semiconductor layer, and the support layer extends from a first position below the first electrode pad to a second position below the second electrode pad.

21. The light-emitting device according to claim 16, wherein:
- the support layer covers the first type doped semiconductor layer and opposite to the light-emitting layer, and the support layer extends from a first position below the first electrode pad to a second position below the second electrode pad.

22. A display apparatus, comprising:
- a driving backplate; and
- a plurality of display pixels, arranged in an array and disposed on the driving backplate, the plurality of display pixels being electrically connected to the driving backplate, wherein each of the plurality of display pixels includes a plurality of sub-pixels, and a part of the plurality of sub-pixels includes at least one light-emitting device comprising:
- an epitaxial layer, comprising a first type doped semiconductor layer, a light-emitting layer and a second type doped semiconductor layer, wherein the light-emitting layer is disposed on a partial area of the first type doped semiconductor layer and is between the first type doped semiconductor layer and the second type doped semiconductor layer;
- a support layer, covering the second type doped semiconductor layer and having an outer surface opposite to the epitaxial layer, wherein the support layer comprises a first area, a second area, and a concave area disposed between the first area and the second area, and a portion of the outer surface corresponding to the concave area recessed inward the epitaxial layer;
- an insulating layer, covering the epitaxial layer and the support layer;
- a first electrode pad, disposed on the first area; and
- a second electrode pad, disposed on the second area, wherein:
  - the first electrode pad and the second electrode pad are disposed on the insulating layer;
  - the first electrode pad and the second electrode pad are electrically connected to the first type doped semiconductor layer and the second type doped semiconductor layer, respectively;
  - the support layer extends from a first position below the first electrode pad to a second position below the second electrode pad;
  - in a thickness direction of the support layer, the concave area does not overlap the first electrode pad and the second electrode pad; and
  - in a top view of the light-emitting device, the support layer comprises a plurality of stripe patterns separated from each other, an extension length of each of the plurality of stripe patterns is greater than a gap between the first electrode pad and the second electrode pad.

* * * * *